(12) United States Patent
Nishio et al.

(10) Patent No.: US 9,786,513 B2
(45) Date of Patent: Oct. 10, 2017

(54) MANUFACTURING METHOD FOR SEMICONDUCTOR DEVICE INCLUDING FIRST AND SECOND THERMAL TREATMENTS

(71) Applicant: Kabushiki Kaisha Toshiba, Minato-ku (JP)

(72) Inventors: Johji Nishio, Machinda (JP); Tatsuo Shimizu, Shinagawa (JP); Takashi Shinohe, Yokosuka (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/690,968

(22) Filed: Apr. 20, 2015

(65) Prior Publication Data
US 2016/0005605 A1 Jan. 7, 2016

(30) Foreign Application Priority Data
Jul. 7, 2014 (JP) .................................. 2014-140042

(51) Int. Cl.
*H01L 21/324* (2006.01)
*H01L 29/16* (2006.01)
(Continued)

(52) U.S. Cl.
CPC ...... *H01L 21/324* (2013.01); *H01L 21/02378* (2013.01); *H01L 21/02529* (2013.01); *H01L 21/046* (2013.01); *H01L 29/1608* (2013.01)

(58) Field of Classification Search
CPC ........... H01L 29/02529; H01L 29/1608; H01L 21/02378; H01L 21/02447
See application file for complete search history.

(56) References Cited

U.S. PATENT DOCUMENTS 7,265,388 B2 * 9/2007 Fukuda ................. H01L 29/045
257/328
2006/0166414 A1 * 7/2006 Carlson ............. H01L 21/02381
438/149
(Continued)

FOREIGN PATENT DOCUMENTS

JP 11-274481 A 10/1999
JP 2006-332495 A 12/2006
(Continued)

OTHER PUBLICATIONS

"Enhanced annealing of the Z1/2 defect in 4H—SiC epilayers" by Liutauras Storasta, Hidekazu Tsuchida, Tetsuya Miyazawa, and Takeshi Ohshima, Journal of Applied Physics 103, 013705 (2008).*
(Continued)

*Primary Examiner* — Eric Ward
(74) *Attorney, Agent, or Firm* — Oblon, McClelland, Maier & Neustadt, L.L.P.

(57) ABSTRACT

In a manufacturing method for a semiconductor device according to an embodiment, a first heat treatment to anneal or oxidize an SiC layer in an atmosphere where a gas including carbon (C) exists is applied. Further, the semiconductor device according to the embodiment includes: an SiC substrate having a first surface and a second surface; a first conductivity type SiC layer disposed on the first surface side of the SiC substrate, and including a low level density region having $Z_{1/2}$ level density of $1 \times 10^{11}$ cm$^{-3}$ or less measured by deep level transient spectroscopy (DLTS); a second conductivity type SiC region disposed on a surface of the SiC layer; a first electrode disposed on the SiC region; and a second electrode disposed on the second surface side of the SiC substrate.

6 Claims, 13 Drawing Sheets

(51) Int. Cl.
*H01L 21/02* (2006.01)
*H01L 21/04* (2006.01)

(56) References Cited

U.S. PATENT DOCUMENTS

| | | | |
|---|---|---|---|
| 2009/0042375 A1* | 2/2009 | Sawada | H01L 21/045 438/522 |
| 2009/0098719 A1* | 4/2009 | Matsuno | H01L 29/6606 438/572 |
| 2009/0224284 A1 | 9/2009 | Nemoto | |
| 2010/0173475 A1 | 7/2010 | Tsuchida et al. | |
| 2013/0183820 A1* | 7/2013 | Hiyoshi | H01L 21/3065 438/589 |
| 2015/0179791 A1* | 6/2015 | Kudou | H01L 29/7813 257/77 |
| 2015/0214049 A1* | 7/2015 | Kawada | C30B 25/20 117/88 |
| 2015/0270128 A1 | 9/2015 | Nishio et al. | |
| 2015/0270351 A1 | 9/2015 | Nishio et al. | |

FOREIGN PATENT DOCUMENTS

| | | |
|---|---|---|
| JP | 2008-53667 A | 3/2008 |
| JP | 2009-049045 | 3/2009 |
| JP | 2009-188336 | 8/2009 |
| JP | 2011-100890 A | 5/2011 |
| JP | 2014-99483 A | 5/2014 |
| JP | 2015-179781 A | 10/2015 |
| JP | 2015-179787 A | 10/2015 |

OTHER PUBLICATIONS

"Reduction of traps and improvement of carrier lifetime in 4H—SiC epilayers by ion implantation" by Liutauras Storasta and Hidekazu Tsuchida, Applied Physics Letters 90, 062116 (2007).*

U.S. Appl. No. 14/656,937, filed Mar. 13, 2015, Johji Nishio, et al.

* cited by examiner

MANUFACTURING METHOD FOR SEMICONDUCTOR DEVICE INCLUDING FIRST AND SECOND THERMAL TREATMENTS

CROSS-REFERENCE TO RELATED APPLICATION

This application is based upon and claims the benefit of priority from Japanese Patent Application No. 2014-140042, filed on Jul. 7, 2014, the entire contents of which are incorporated herein by reference.

FIELD

Embodiments described herein relate generally to a manufacturing method for a semiconductor device and a semiconductor device.

BACKGROUND

As a material for a next generation power semiconductor device, silicon carbide (SiC) attracts attention. SiC has excellent physical properties, having three times bandgap, about ten times breakdown field strength, and about three times thermal conductivity, compared to silicon (Si). Utilizing such properties, a semiconductor device capable of operating at high voltage, low loss, and high temperature can be achieved.

On the other hand, there may be a problem in SiC in which a minority carrier lifetime is shortened or channel mobility is decreased due to a defect such as a carbon vacancy. There is a method to introduce carbon (C) into SiC by an ion implantation method in order to reduce an amount of carbon vacancies inside SiC.

DETAILED DESCRIPTION

In a manufacturing method for a semiconductor device according to an embodiment, a first heat treatment to anneal or oxidize an SiC layer in an atmosphere where a gas including carbon (C) exists is applied.

Embodiments of the present disclosure will be described below with reference to the drawings. Note that, in the following description, a same component and the like will be denoted by a same reference sign, and a description for a component and the like once described will be suitably omitted.

Further, in the following description, $n^+$, n, $n^-$ and $p^+$, p, $p^-$ represent relative levels of impurity concentrations in respective conductivity types. More specifically, $n^+$ indicates that an n-type impurity concentration is relatively higher than n, and $n^-$ indicates that the n-type impurity concentration is relatively lower than n. Further, $p^+$ indicates that a p-type impurity concentration is relatively higher than p, and $p^-$ indicates that the p-type impurity concentration is relatively lower than p. Note that there may be cases where $n^+$-type and $n^-$-type are simply recited as n-type, and $p^+$-type and $p^-$-type simply as p-type.

Further, note that "annealing" in the present specification means the heat treatment without growth of a film.

First Embodiment

A semiconductor device according to a present embodiment includes: an SiC substrate having a first surface and a second surface mutually facing; a first conductivity type SiC layer disposed on the first surface side of the SiC substrate and including a low level density region having $Z_{1/2}$ level density of $1 \times 10^{11}$ cm$^{-3}$ or less measured by a deep level transient spectroscopy (DLTS); a second conductivity type SiC region disposed on a surface of the SiC layer; a first electrode disposed on the SiC region; and a second electrode disposed on the second surface side of the SiC substrate.

Figure 1:
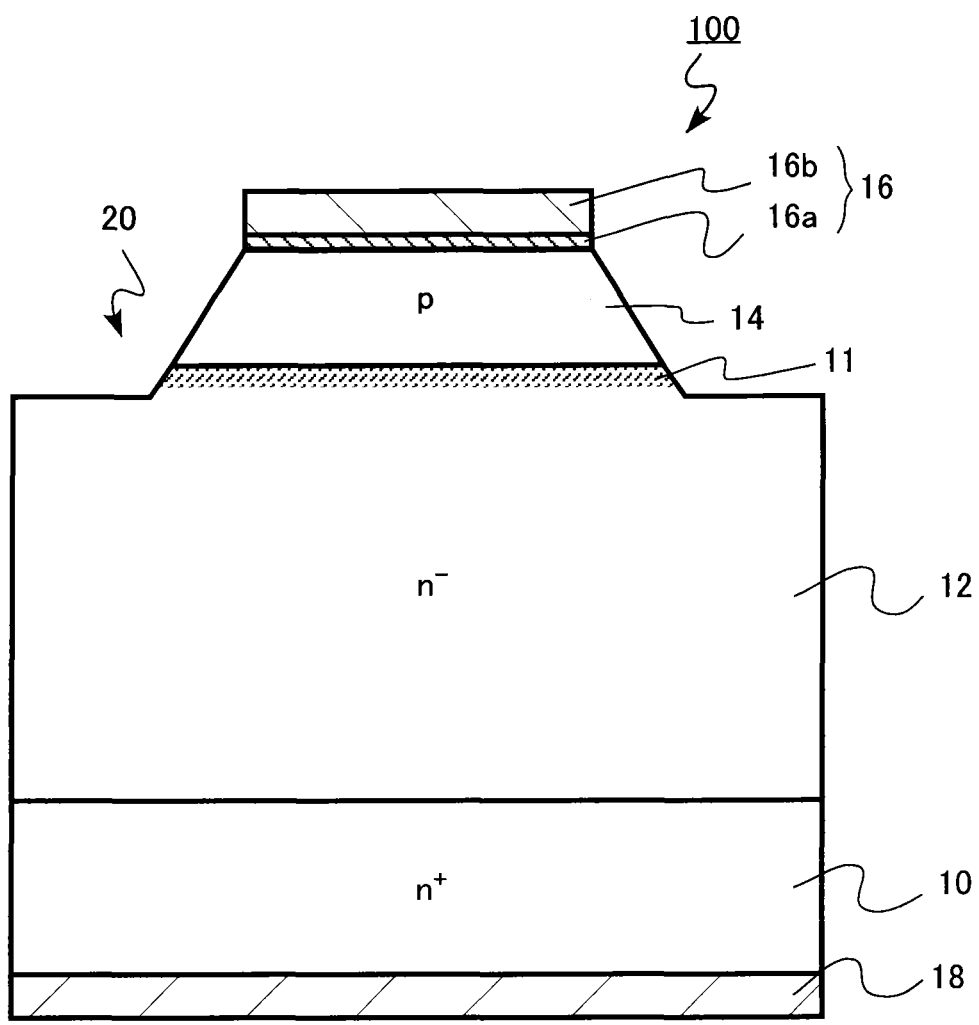
FIG. 1 is a schematic cross-sectional diagram illustrating a semiconductor device according to a first embodiment.

Further, in the manufacturing method for the semiconductor device according to the present embodiment, first heat treatment to anneal or oxidize the SiC layer in an atmosphere where a gas including carbon (C) exists is applied. FIG. 1 is a schematic cross-sectional diagram illustrating the semiconductor device according to the present embodiment. A semiconductor device 100 according to the present embodiment is a mesa type PIN diode.

The PIN diode 100 includes an SiC substrate 10. The SiC substrate 10 is, for example, an n+-type single crystal SiC substrate. For example, the SiC substrate 10 is a 4H—SiC substrate having a surface inclined from a plane {0001} at an off angle of 0.2 degrees or more and 10 degrees or less. The SiC substrate 10 includes, for example, nitrogen (N) as an n-type impurity. The impurity concentration of the SiC substrate 10 is, for example, $1\times10^{17}$ cm$^{-3}$ or more and $1\times10^{20}$ cm$^{-3}$ or less. The SiC substrate 10 includes the first surface and the second surface mutually facing.

An n−-type SiC layer 12 is formed on the first surface of the SiC substrate 10. The n−-type SiC layer 12 is an epitaxial growth layer. The n−-type SiC layer 12 is a drift layer of the PIN diode 100.

The n−-type SiC layer 12 includes, for example, nitride (N) as the n-type impurity. The n−-type SiC layer 12 has the impurity concentration of $1\times10^{15}$ cm$^{-3}$ or more and $5\times10^{16}$ cm$^{-3}$ or less, for example. The n−-type SiC layer 12 has a film thickness of 5 μm or more and 200 μm or less, for example.

The n−-type SiC layer 12 includes a low level density region 11 having $Z_{1/2}$ level density of $1\times10^{11}$ cm$^{-3}$ or less measured by the deep level transient spectroscopy (DLTS). In the low level density region 11, for example, a concentration of the carbon vacancies is lower, compared to the SiC layer 12 on the SiC substrate 10 side.

A p-type SiC region (anode region) 14 including a p-type impurity is formed on the n−-type SiC layer 12. The p-type SiC region 14 includes, for example, aluminum (Al) as the p-type impurity and has the impurity concentration of $1\times10^{16}$ cm$^{-3}$ or more and $1\times10^{22}$ cm$^{-3}$ or less. The p-type SiC region 14 has the film thickness of, for example, 0.2 μm or more and 3.0 μm or less.

Preferably, the low level density region 11 exists in a range of 0.3 μm or less from an interface between the n−-type SiC layer 12 and the p-type SiC region 14 on the SiC substrate 10 side.

The PIN diode 100 includes a conductive first electrode (anode electrode) 16 electrically connected to the p-type SiC region 14. The anode electrode 16 is formed of, for example, a nickel (Ni) barrier metal layer 16a and an aluminum (Al) metal layer 16b disposed on the barrier metal layer 16a.

Further, a conductive second electrode (cathode electrode) 18 is formed on a back surface (second surface) of the SiC substrate 10. The cathode electrode 18 is, for example, nickel (Ni).

In the PIN diode 100, a groove portion 20 reaching to the n-type SiC layer 12 from the surface of the p-type SiC region 14 is disposed on both sides of the anode electrode 16. The groove portion 20 is, for example, filled with an oxide film not illustrated. By providing the groove portion 20, leak current is reduced and the high-voltage PIN diode 100 is implemented.

Meanwhile, according to the present embodiment, preferably, nitride (N) or phosphorus (P) is applied as the n-type impurity, for example, but arsenic (As) or the like may also be applicable. Further, preferably, aluminum (Al) is applied as the p-type impurity, for example, but boron (B), gallium (Ga), indium (In), or the like may also be applicable.

Next, the manufacturing method for the semiconductor device according to the embodiment will be described. FIGS. 2 to 5 are schematic cross-sectional diagrams illustrating the semiconductor device in the course of manufacture in the manufacturing method for the semiconductor device according to the first embodiment.

First, the low-resistance 4H—SiC single crystal n+-type SiC substrate 10 including, for example, nitride (N) as the n-type impurity is prepared, in which the n-type impurity concentration is about $5\times10^{18}$ cm$^{-3}$ and the thickness of the substrate is, for example, 300 μm.

Figure 2:
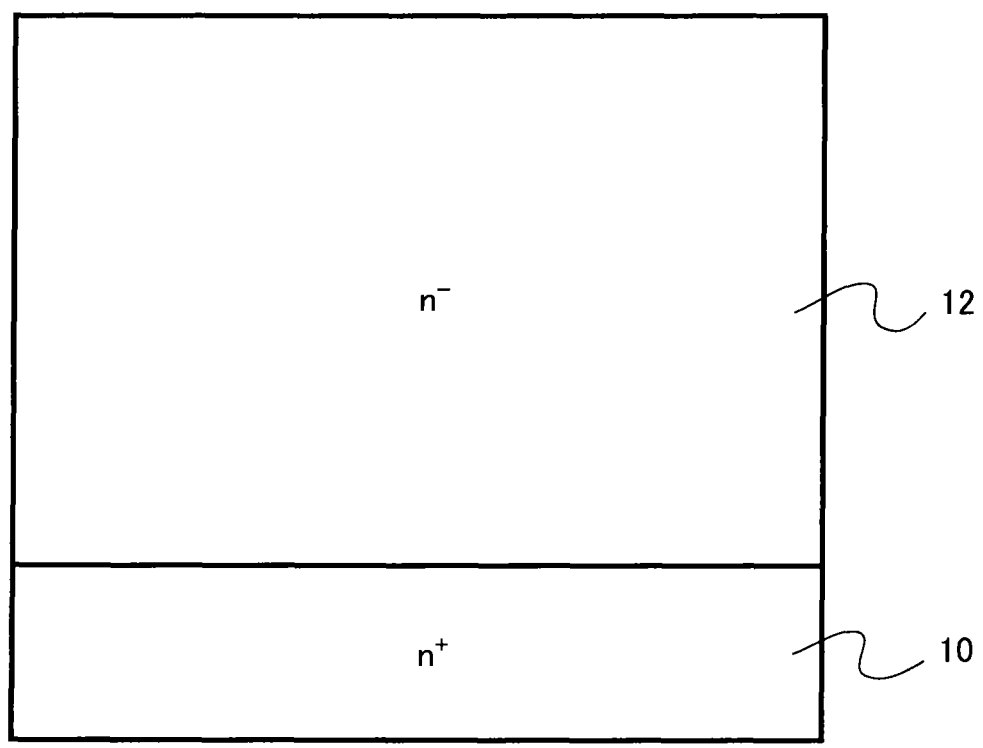
FIG. 2 is a schematic cross-sectional diagram illustrating the semiconductor device in the course of manufacture in a manufacturing method for the semiconductor device according to the first embodiment.

Next, the high-resistance n−-type SiC layer 12 having the thickness of about 50 μm is epitaxially grown by an epitaxial growth method on one of the surfaces (first surface) of the SiC substrate 10, and the SiC layer 12 includes N as the n-type impurity having the impurity concentration of about $1\times10^{16}$ cm$^{-3}$, for example (FIG. 2).

Figure 3:
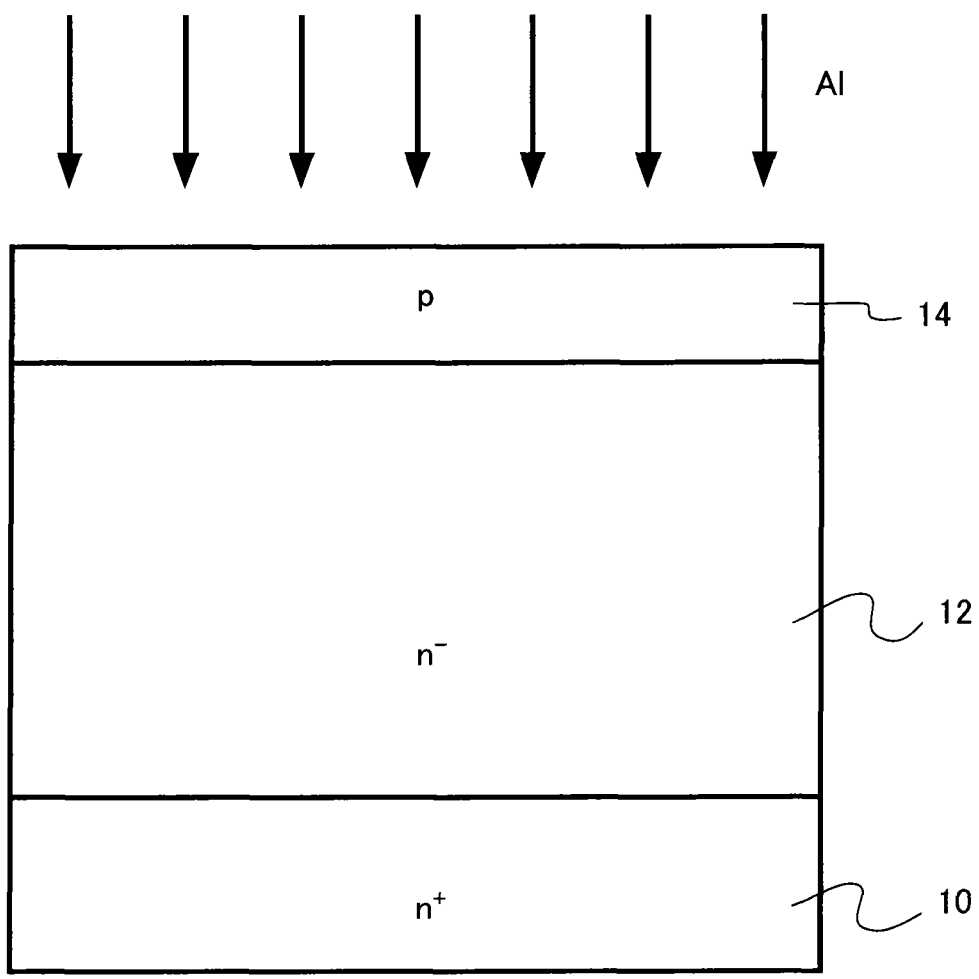
FIG. 3 is a schematic cross-sectional diagram illustrating the semiconductor device in the course of manufacture in the manufacturing method for the semiconductor device according to the first embodiment.

Next, an ion of aluminum (Al) as the p-type impurity is implanted into the n−-type SiC layer 12. The p-type SiC region 14 is formed by this ion implantation (FIG. 3). An Al dose amount for ion implantation is, for example, $1\times10^{14}$ cm$^{-2}$ or more and $1\times10^{16}$ cm$^{-2}$ or less. Preferably, the Al dose amount is $1\times10^{15}$ cm$^{-2}$ or more.

The p-type SiC region 14 can be selectively formed on the n−-type SiC layer 12 by using a mask or the like.

Next, annealing (second thermal treatment) to activate the ion-implanted p-type impurity is applied. Preferably, this annealing is applied in an inert gas atmosphere at the temperature of 1600° C. or more and 1800° C. or less. In the case where the temperature is lower than the above temperature range, the impurity may not be sufficiently activated. Further, in the case where the temperature is higher than the range, Si desorption from the surface may be excessive. Preferably, a carbon film is formed on the surface of the p-type SiC region 14 as a cap film before the thermal treatment from the viewpoint of preventing such Si on the surface from desorbing during the thermal treatment. Preferably, the thermal treatment is applied at the temperature higher than annealing (first thermal treatment) executed later in the atmosphere where the gas including carbon (C) exists.

Next, annealing (first thermal treatment) is applied in the atmosphere where the gas including carbon (C) exists. This annealing introduces carbon (C) into the n−-type SiC layer 12, and reduces the carbon vacancy existing in the n−-type SiC layer 12. Preferably, a flow volume of the gas including carbon (C) in the atmosphere is 100 ppm or more, and more preferably, 250 ppm or more from the viewpoint of efficiently introducing carbon (C).

Note that the "atmosphere where the gas including carbon (C) exists" indicates an atmosphere where the gas including carbon (C) is actively introduced, and indicates a concept that an atmosphere mixed with a gas inevitably including carbon (C) of, for example, 50 ppm or less as an entire flow volume is excluded.

Figure 4:
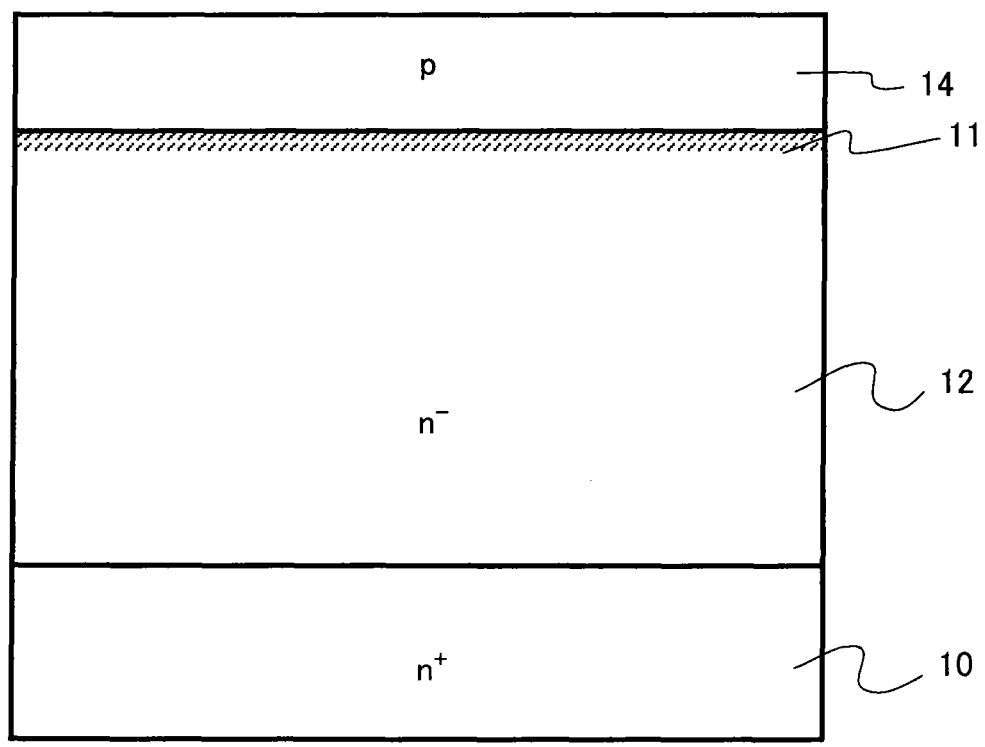
FIG. 4 is a schematic cross-sectional diagram illustrating the semiconductor device in the course of manufacture in the manufacturing method for the semiconductor device according to the first embodiment.

By this annealing, the low level density region 11 having the $Z_{1/2}$ level density of $1\times10^{11}$ cm$^{-3}$ or less measured by the DLTS is formed on the n−-type SiC layer 12 (FIG. 4). In the low level density region 11, for example, the concentration of the carbon vacancies is lower, compared to the SiC layer 12 on the SiC substrate 10 side. The low level density region 11 is formed in the range of 0.3 μm or less from the interface between the n−-type SiC layer 12 and the p-type SiC region 14 on the SiC substrate 10 side.

Preferably, the low level density region 11 having the $Z_{1/2}$ level density of $1\times10^{11}$ cm$^{-3}$ or less measured by the DLTS is also formed inside the p-type SiC region 14.

The gas including carbon (C) is, for example, a gas of hydrocarbon. Preferably, the gas of hydrocarbon is the hydrocarbon which becomes a gas at ordinary temperatures and pressures and has a carbon number of four or less. The hydrocarbon is, for example, methane, propane, or acetylene.

Preferably, the annealing (first thermal treatment) is applied at the temperature 1000° C. or higher and lower than 1600° C. In the case where the temperature is lower than the above range, carbon (C) may not be sufficiently introduced into the SiC layer 12. Further, in the case where the temperature is higher than the above range, an equilibrium concentration of the carbon vacancy inside the SiC layer 12 becomes high. Therefore, a sufficient effect of reducing an amount of carbon vacancies may not be obtained. Preferably, this annealing (first thermal treatment) is applied at the temperature lower than that of the second thermal treatment.

In the case where the gas including carbon (C) is hydrocarbon, preferably, the temperature at the time of this annealing (first thermal treatment) is equal to or higher than a temperature at which carbon-carbon bonding of hydrocarbon is cut. Efficiency of introducing carbon (C) into the SiC layer 12 is improved by the carbon-carbon bonding of hydrocarbon being cut. In the case of acetylene, for example, the temperature at which the carbon-carbon bonding of hydrocarbon is cut is about 1000° C. Further, in the case of propane, the temperature is about 1400° C.

Annealing can be applied in an atmosphere where the gas including carbon (C) is diluted with, for example, a hydrogen gas or an inactive gas.

Meanwhile, preferably, oxygen is not included in the atmosphere from the viewpoint of preventing an oxide film from being formed on the surface of the SiC layer 12 and improving the efficiency of introducing carbon (C) into the SiC layer 12. However, a carbon oxide gas such as carbon monoxide or carbon dioxide can be also applied as the gas including carbon (C), for example. In this case, oxidation (first thermal treatment) is executed in the atmosphere where the gas including carbon (C) exists.

Figure 5:
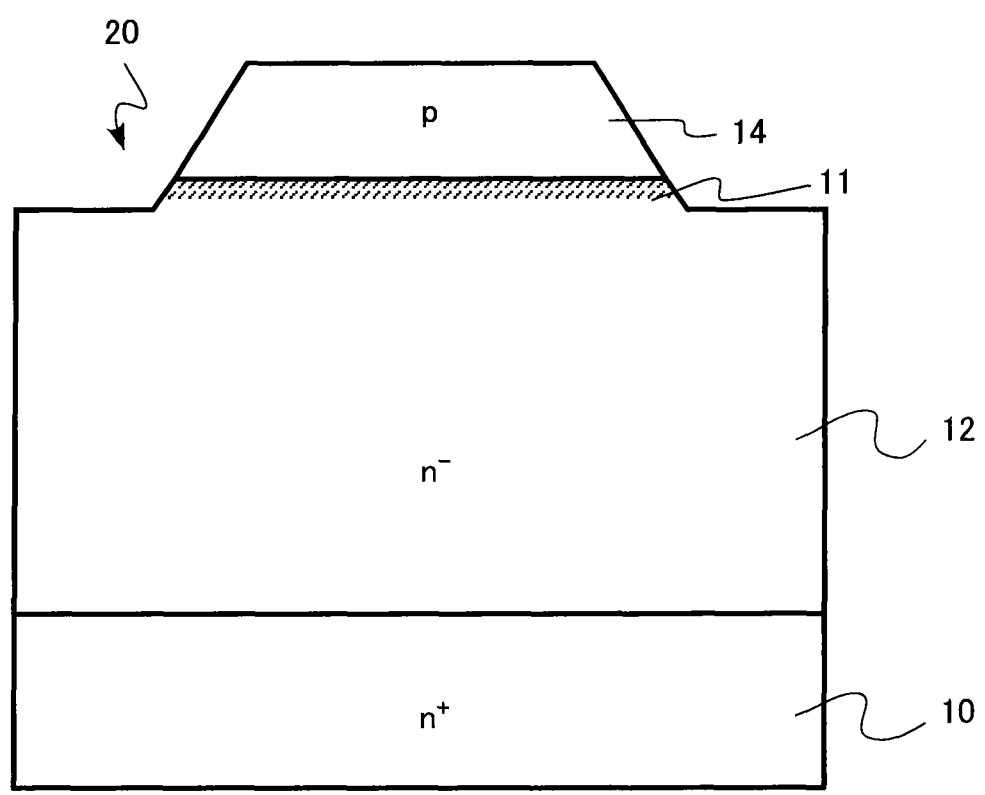
FIG. 5 is a schematic cross-sectional diagram illustrating the semiconductor device in the course of manufacture in the manufacturing method for the semiconductor device according to the first embodiment.

Next, the groove portion 20 reaching to the n⁻-type SiC layer 12 from the surface of the p-type SiC region 14 is formed by patterning of photo-lithography and etching (FIG. 5). Subsequently, for example, the groove portion 20 may be filled with the oxide film not illustrated.

Next, the conductive first electrode (anode electrode) 16 electrically connected to the p-type SiC region 14 is formed. The anode electrode 16 is formed of, for example, a sputter of nickel (Ni) and Al.

Next, the conductive second electrode (cathode electrode) 18 is formed on the back surface side (second surface) of the SiC substrate 10. The cathode electrode 18 is formed of, for example, a sputter of Ni.

After that, low-temperature annealing is applied in order to reduce contact resistance of the anode electrode 16 and the cathode electrode 18. Annealing is applied at the temperature 400° C. in an argon atmosphere.

The PIN diode 100 illustrated in FIG. 1 is formed by the above-described manufacturing method.

In the following, functions and effects of the present embodiment will be described in detail.

There may be a problem in a bipolar device such as the PIN diode in which the carbon vacancy inside SiC becomes a lifetime killer of a minority carrier, and on-voltage ($V_F$) becomes high. The on-voltage means the voltage to be applied between electrodes such as the anode electrode and the cathode electrode in order to flow predetermined current.

According to the manufacturing method of the present embodiment, carbon (C) is introduced into the SiC layer 12 by annealing or oxidizing the SiC layer 12 in the atmosphere where the gas including carbon (C) exists. Further, the carbon vacancy inside the SiC layer 12 is filled with the introduced carbon (C), and the concentration of the carbon vacancies is reduced. A region where the concentration of the carbon vacancies is reduced becomes the low level density region 11. Therefore, the PIN diode 100 having the low on-voltage can be implemented.

Additionally, according to the manufacturing method of the present embodiment, carbon (C) is introduced from a gas phase. Therefore, a defect such as dislocation inside a crystal is more prevented from being generated, compared to the case where carbon (C) is introduced by ion implantation. Therefore, deterioration of a device property caused by introducing carbon (C) can be reduced.

Further, in the case where carbon (C) is introduced by ion implantation, preferably, high-temperature annealing at the temperature of, for example, 1600° C. or higher is applied in order to recover damage from the ion implantation and to activate carbon (C). The higher the temperature is, the higher the equilibrium concentration of carbon vacancy inside SiC tends to be. Therefore, the amount of carbon vacancies may not be sufficiently reduced by the high-temperature annealing.

According to the present embodiment, the amount of carbon vacancies can be more reduced by a low-temperature process, compared to ion implantation. Therefore, the concentration of the carbon vacancies inside SiC can be more reduced.

Moreover, according to the present embodiment, the SiC layer 12 is annealed or oxidized in the atmosphere where the gas including carbon (C) exists after the p-type SiC region 14 is formed inside the n⁻-type SiC layer 12 by implanting Al ions. Inside the p-type SiC region 14 or the n⁻-type SiC layer 12, a defect caused by ion implantation remains. The defect thus caused by ion implantation may shorten the lifetime of the minority carrier and prevent the minority carrier from being injected into the drift layer, thereby increasing on-resistance of the PIN diode.

According to the present embodiment, carbon (C) is introduced into the SiC layer 12 including the p-type SiC region 14 from the atmosphere where the gas including carbon (C) exists, and the defect caused by ion implantation is inactivated. Therefore, the PIN diode 100 having low on-voltage can be implemented.

According to the present embodiment, a description has been given for the case where annealing (second thermal treatment) for activation after ion implantation and the thermal treatment of carbon (C) introduction (first thermal treatment) are the separate processes. However, both processes can be made common and can be executed as one process. More specifically, the process of annealing or oxidizing the SiC layer 12 in the atmosphere where the gas including carbon (C) exists can be also executed, combining impurity activation with carbon (C) introduction after ion implantation.

According to the present embodiment, the manufacturing method for the PIN diode and the PIN diode, capable of reducing an amount of defects such as the carbon vacancies, can be implemented.

Second Embodiment

A semiconductor device according to a present embodiment includes: a first conductivity type SiC substrate having a first surface and a second surface mutually facing; a first conductivity type SiC layer disposed on the first surface side of the SiC substrate; a second conductivity type first SiC region disposed on a surface of the SiC layer and including a low level density region having $Z_{1/2}$ level density of $1 \times 10^{11}$ cm$^{-3}$ or less measured by a deep level transient spectroscopy (DLTS); a first conductivity type second SiC region disposed on a surface of the first SiC region; a gate insulating film continuously disposed on surfaces of the SiC layer and the first SiC region; a gate electrode disposed on the gate insulating film; a first electrode disposed on the second SiC region; and a second electrode disposed on the second surface side of the SiC substrate.

Further, in the manufacturing method for the semiconductor device according to the present embodiment, first heat treatment to anneal or oxidize the SiC layer in an atmosphere where a gas including carbon (C) exists is applied.

Figure 6:
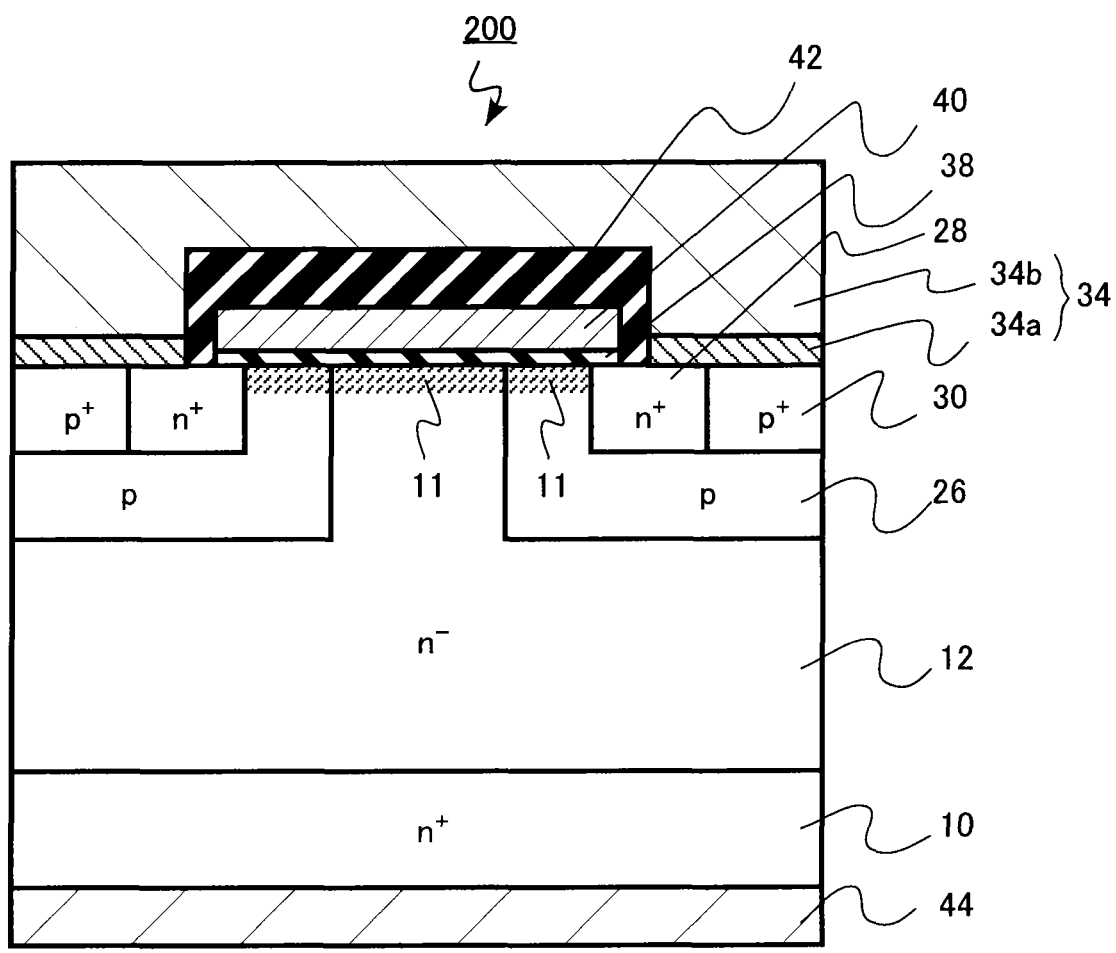
FIG. 6 is a schematic cross-sectional diagram illustrating a semiconductor device according to a second embodiment.

FIG. 6 is a schematic cross-sectional diagram illustrating the semiconductor device according to the present embodiment. A semiconductor device 200 according to the present embodiment is a Metal Oxide Semiconductor Field Effect Transistor (MOSFET). The MOSFET 200 is, for example, a Double Implantation MOSFET (DIMOSFET) formed by implanting ions into a p-well and a source region.

The MOSFET 200 includes an SiC substrate 10. The SiC substrate 10 is, for example, an n$^+$-type single crystal SiC substrate. For example, the SiC substrate 10 is a 4H—SiC substrate having a surface inclined from a plane {0001} at an off angle of 0.2 degrees or more and 10 degrees or less. The SiC substrate 10 includes, for example, nitrogen (N) as an n-type impurity. An impurity concentration of the SiC substrate 10 is, for example, $1\times10^{17}$ cm$^{-3}$ or more and $1\times10^{20}$ cm$^{-3}$ or less. The SiC substrate 10 includes the first surface and the second surface.

An n$^-$-type SiC layer 12 is formed on the first surface of the SiC substrate 10. The n$^-$-type SiC layer 12 is an epitaxial growth layer. The n$^-$ type SiC layer 12 is a drift layer of the MOSFET 200.

The n$^-$-type SiC layer 12 includes, for example, nitride (N) as the n-type impurity. The n$^-$-type SiC layer 12 has the impurity concentration of $1\times10^{15}$ cm$^{-3}$ or more and $5\times10^{16}$ cm$^{-3}$ or less, for example. The n-type SiC layer 12 has film thickness of, for example, 5 μm or more and 200 μm or less.

A surface of the n$^-$-type SiC layer 12 is partly formed with a p-type first SiC region (p-well region) 26 having the impurity concentration of the p-type impurity, for example, $5\times10^{15}$ or more and $1\times10^{17}$ cm$^{-3}$ or less. The p-well region 26 has a depth of, for example, about 0.6 μm. The p-well region 26 functions as a channel region of the MOSFET 200.

The p-type first SiC region (p-well region) 26 includes a low level density region 11 having the $Z_{1/2}$ level density of $1\times10^{11}$ cm$^{-3}$ or less measured by the DLTS. Further, the low level density region 11 having the $Z_{1/2}$ level density of $1\times10^{11}$ cm$^{-3}$ or less measured by the DLTS is also formed on the n$^-$-type SiC layer 12 interposed by the p-well region 26. In the low level density region 11, for example, a concentration of carbon vacancies is more reduced, compared to the p-well region 26 on the SiC substrate 10 side and the SiC layer 12.

A surface of the first SiC region (p-well region) 26 is partly formed with, for example, an n$^+$-type second SiC region (source region) 28 having the impurity concentration of the n-type impurity, for example, $1\times10^{18}$ or more and $1\times10^{22}$ cm$^{-3}$ or less. The source region 28 has a depth smaller than the depth of the first SiC region (p-well region) 26, for example, about 0.3 μm.

Further, a p$^+$-type third SiC region (p-well contact region) 30 having the impurity concentration of the p-type impurity, for example, substantially $1\times10^{18}$ or more and $1\times10^{22}$ cm$^{-3}$ or less is formed on a part of the surface of the first SiC region (p-well region) 26 on a side next to the n$^+$-type second SiC region (source region) 28. The p-well contact region 30 has the depth smaller than the depth of the first SiC region (p-well region) 26, for example, about 0.3 μm.

A gate insulating film 38 is continuously formed on the surfaces of the SiC layer 12 and the first SiC region (p-well region) 26 so as to extend across the layer and the region. For the gate insulating film 38, for example, an SiO$_2$ film or a high-k insulator film is applicable.

Further, a gate electrode 40 is formed on the gate insulating film 38. For the gate electrode 40, for example, polysilicon or the like is applicable. On the gate electrode 40, an interlayer dielectric 42 formed of the SiO$_2$ film is formed, for example.

The first SiC region 26 interposed between the second SiC region (source region) 28 and the SiC layer 12 under the gate electrode 40 functions as the channel region of the MOSFET 200.

Preferably, the low level density region 11 is located in a range of 0.3 μm or less from an interface located between the first SiC region 26 and the gate insulating film 38 and between the SiC layer 12 and the same gate insulating film 38 on the SiC substrate 10 side.

Further, a conductive first electrode (source/p-well common electrode) 34 electrically connected to the second SiC region (source region) 28 and the third SiC region (p-well contact region) 30 is provided. The source/p-well common electrode 34 is formed of, for example, a nickel (Ni) barrier metal layer 34a and an Al metal layer 34b disposed on the barrier metal layer 34a. The Ni barrier metal layer 34a and the Al metal layer 34b may form alloy by reaction.

Further, a conductive second electrode (drain electrode) 44 is formed on the second surface of the SiC substrate 10. The drain electrode 44 is, for example, Ni.

Meanwhile, according to the present embodiment, preferably, nitride (N) or phosphorus (P) is applied as the n-type impurity, for example, but arsenic (As) or the like may also be applicable. Further, preferably, aluminum (Al) is applied as the p-type impurity, for example, but boron (B), gallium (Ga), indium (In), or the like may also be applicable.

Next, the manufacturing method for the semiconductor device according to the embodiment will be described. FIGS. 7 to 12 are schematic cross-sectional diagrams illustrating the semiconductor device in the course of the manufacture in the manufacturing method for the semiconductor device according to the second embodiment.

First, the low-resistance 4H—SiC single crystal n$^+$-type SiC substrate 10 including, for example, nitride (N) as the n-type impurity is prepared, in which the n-type impurity concentration is about $5\times10^{18}$ cm$^{-3}$ and the thickness of the substrate is, for example, 300 μm.

Figure 7:
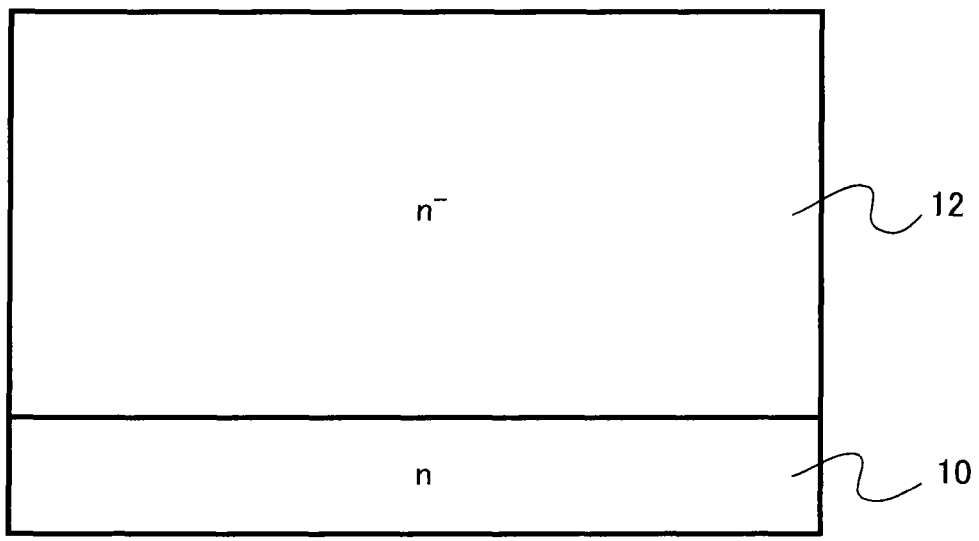
FIG. 7 is a schematic cross-sectional diagram illustrating the semiconductor device in the course of manufacture in the manufacturing method for the semiconductor device according to the second embodiment.

Next, the high-resistance n$^-$-type SiC layer 12 having the thickness of about 50 μm is epitaxially grown by an epitaxial growth method on one of the surface (first surface) of the SiC substrate 10, and the SiC layer 12 includes N as the n-type impurity having the impurity concentration of about $1\times10^{16}$ cm$^{-3}$, for example (FIG. 7).

Figure 8:
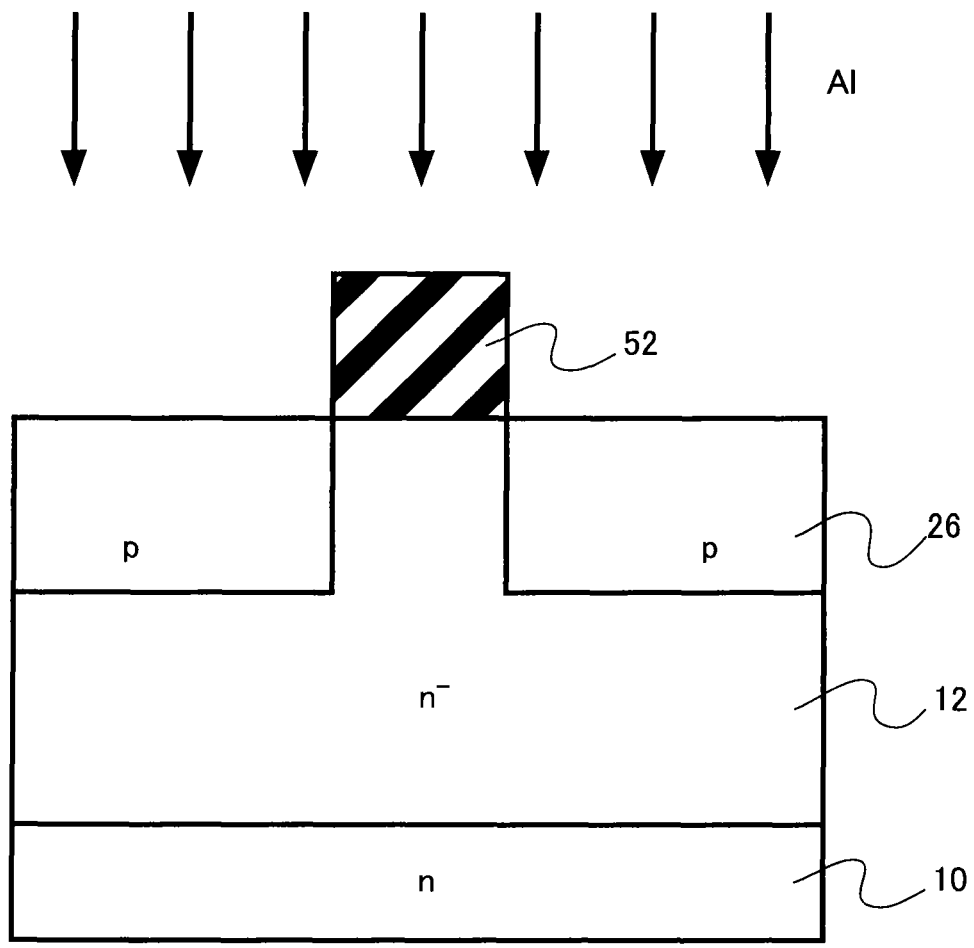
FIG. 8 is a schematic cross-sectional diagram illustrating the semiconductor device in the course of manufacture in the manufacturing method for the semiconductor device according to the second embodiment.

Next, for example, an SiO$_2$ first mask member 52 is formed by patterning of photo-lithography and etching. Further, an ion of Al which is the p-type impurity is implanted into the n$^-$-type SiC layer 12 by using the first mask member 52 as an ion implantation mask, and the p-type first SiC region (p-well region) 26 is formed (FIG. 8). An Al dose amount for ion implantation is, for example, $1\times10^{13}$ cm$^{-2}$ or more and $1\times10^{15}$ cm$^{-2}$ or less.

Figure 9:
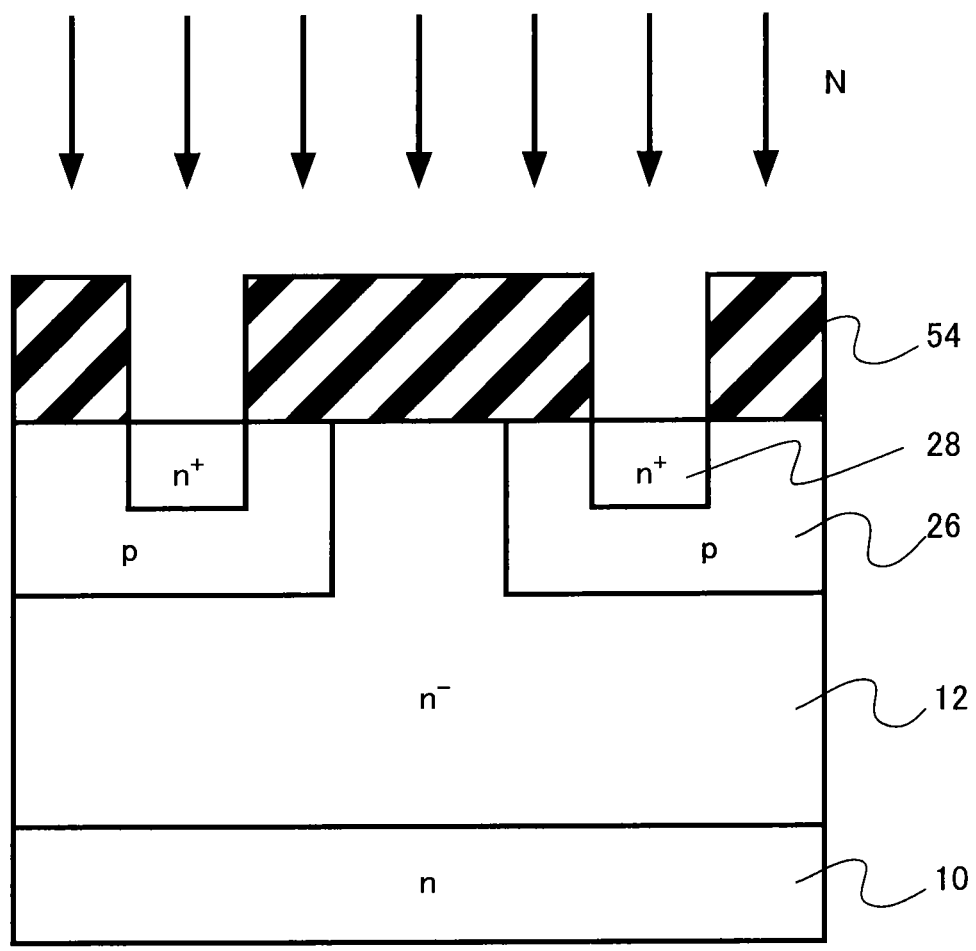
FIG. 9 is a schematic cross-sectional diagram illustrating the semiconductor device in the course of manufacture in the manufacturing method for the semiconductor device according to the second embodiment.

Next, for example, an SiO$_2$ second mask member 54 is formed by patterning of photo-lithography and etching. Subsequently, an ion of N which is n-type impurity is implanted into the n$^-$-type SiC layer 12 by using the second mask member 54 as the ion implantation mask, and the second SiC region (source region) 28 is formed (FIG. 9). An N dose amount for ion implantation is, for example, $1\times10^{14}$ $cm^{-2}$ or more and $1\times10^{16}$ $cm^{-2}$ or less. Preferably, the N dose amount is $1\times10^{15}$ $cm^{-2}$ or more.

Figure 10:
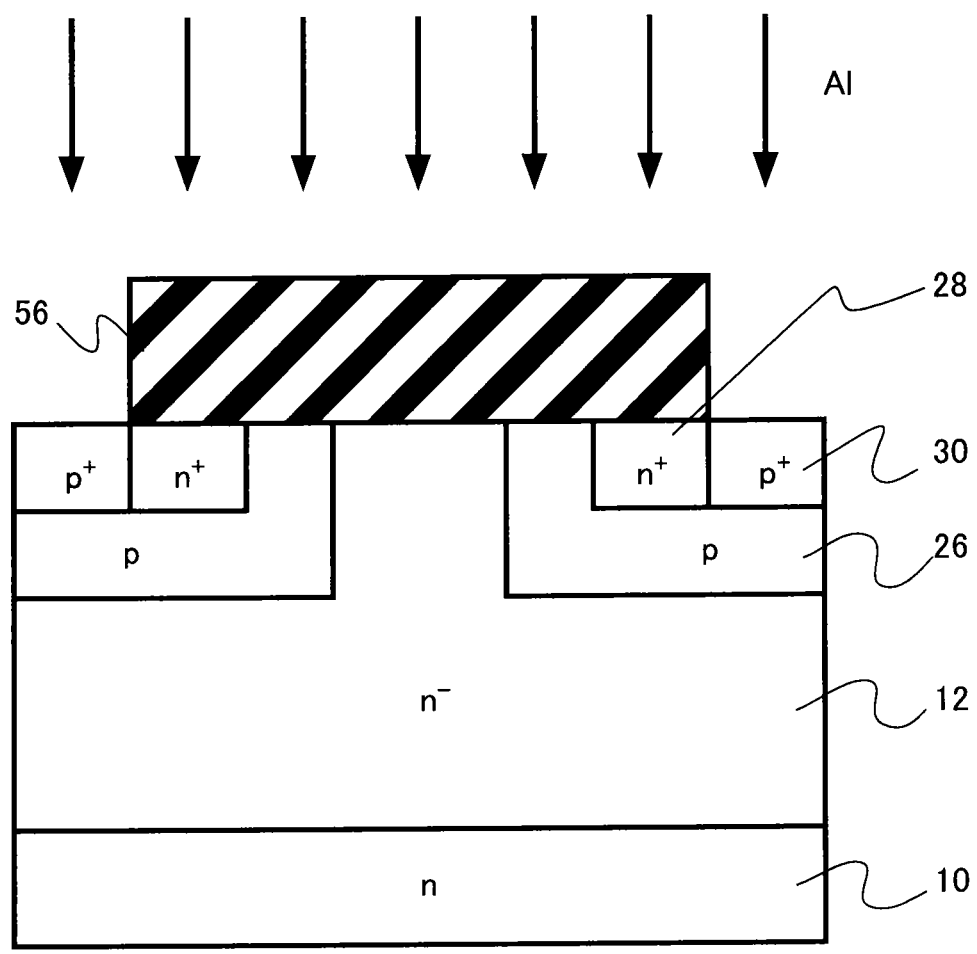
FIG. 10 is a schematic cross-sectional diagram illustrating the semiconductor device in the course of manufacture in the manufacturing method for the semiconductor device according to the second embodiment.

Next, for example, an $SiO_2$ third mask member 56 is formed by patterning of photo-lithography and etching. Further, the Al ion which is the p-type impurity is implanted into the $n^-$-type SiC layer 12 by using the third mask member 56 as the ion implantation mask, the third SiC region (p-well contact region) 30 is formed (FIG. 10). The Al dose amount for ion implantation is, for example, $1\times10^{14}$ $cm^{-2}$ or more and $1\times10^{16}$ $cm^{-2}$ or less. Preferably, the Al dose amount is $1\times10^{15}$ $cm^{-2}$ or more.

Next, annealing (second thermal treatment) to activate the ion-implanted p-type impurity and n-type impurity is applied. Preferably, this annealing is applied in an inert gas atmosphere at the temperature of 1600° C. or more and 1800° C. or less. In the case where the temperature is lower than the above temperature range, the impurity may not be sufficiently activated. Further, in the case where the temperature is higher than the range, Si desorption from the surface may be excessive. Preferably, a carbon film is formed on the surface of the $n^-$-type SiC region 12 as a cap film before the thermal treatment from the viewpoint of preventing such Si on the surface from desorbing during the thermal treatment.

Next, annealing (first thermal treatment) is applied in the atmosphere where the gas including carbon (C) exists. This annealing introduces carbon (C) at least into the p-type first SiC region (p-well region) 26 and reduces an amount of the carbon vacancies existing inside the p-type first SiC region (p-well region) 26.

Figure 11:
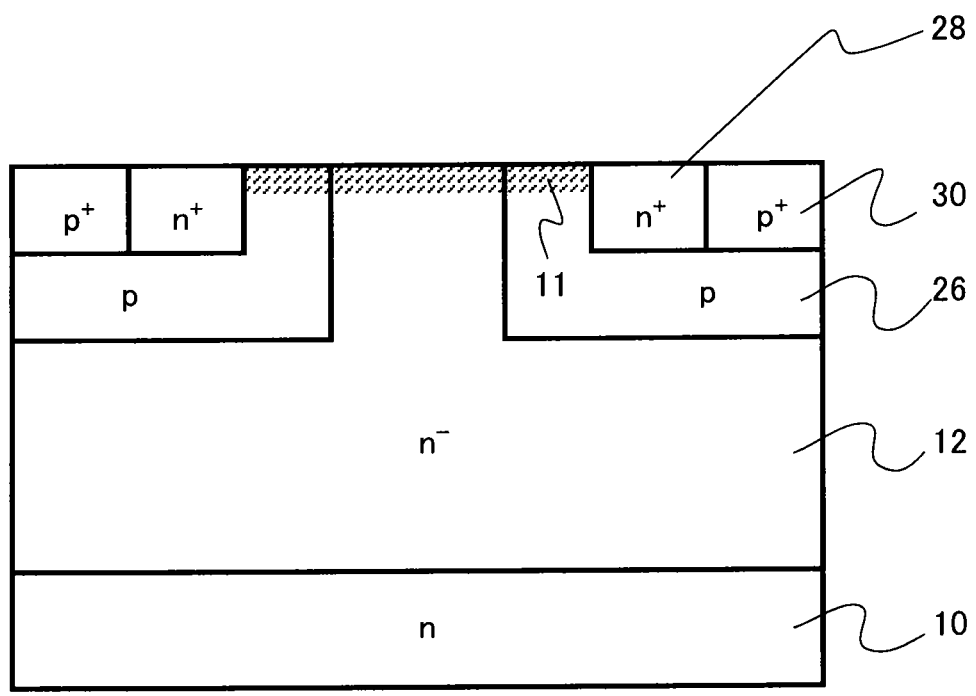
FIG. 11 is a schematic cross-sectional diagram illustrating the semiconductor device in the course of manufacture in the manufacturing method for the semiconductor device according to the second embodiment.

By this annealing (first thermal treatment), the low level density region 11 having the $Z_{1/2}$ level density of $1\times10^{11}$ $cm^{-3}$ or less measured by the DLTS is formed on the p-type first SiC region (p-well region) 26 (FIG. 11). Preferably, the low level density region 11 is formed in a range of 0.3 μm or less from an interface between the first SiC region 26 and the gate insulating film 38.

By this anneal (first thermal treatment), preferably the low level density region 11 having the $Z_{1/2}$ level density of $1\times10^{11}$ $cm^{-3}$ or less measured by the DLTS is also formed on the $n^-$-type SiC layer 12 interposed by the p-well region 26.

The gas including carbon (C) is, for example, a gas of hydrocarbon. Preferably, the gas of hydrocarbon is the hydrocarbon which becomes a gas at ordinary temperatures and pressures and has a carbon number of four or less. The hydrocarbon is, for example, methane, propane, or acetylene.

Preferably, this annealing (first thermal treatment) is applied at the temperature 1000° C. or higher and lower than 1600° C. In the case where the temperature is lower than the above range, carbon (C) may not be sufficiently introduced into the SiC layer 12. Further, in the case where the temperature is higher than the above range, an equilibrium concentration of the carbon vacancy inside the SiC layer 12 becomes high. Therefore, a sufficient effect of reducing an amount of carbon vacancies may not be obtained.

In the case where the gas including carbon (C) is hydrocarbon, preferably, the temperature at the time of this annealing (first thermal treatment) is equal to or higher than a temperature at which carbon-carbon bonding of hydrocarbon is cut. Efficiency of introducing carbon (C) into the SiC layer 12 is improved by the carbon-carbon bonding of hydrocarbon being cut. In the case of acetylene, for example, the temperature at which the carbon-carbon bonding of hydrocarbon is cut is about 1000° C. Further, in the case of propane, the temperature is about 1400° C.

Annealing can be applied in an atmosphere where the gas including carbon (C) is diluted with, for example, a hydrogen gas or an inactive gas.

Meanwhile, preferably, oxygen is not included in the atmosphere from the viewpoint of preventing an oxide film from being formed on the surface of the SiC layer 12 and improving the efficiency of introducing carbon (C) into the SiC layer 12. However, a carbon oxide gas such as carbon monoxide or carbon dioxide can be also applied as the gas including carbon (C), for example. In this case, oxidation (first thermal treatment) is applied in the atmosphere where the gas including carbon (C) exists.

Figure 12:
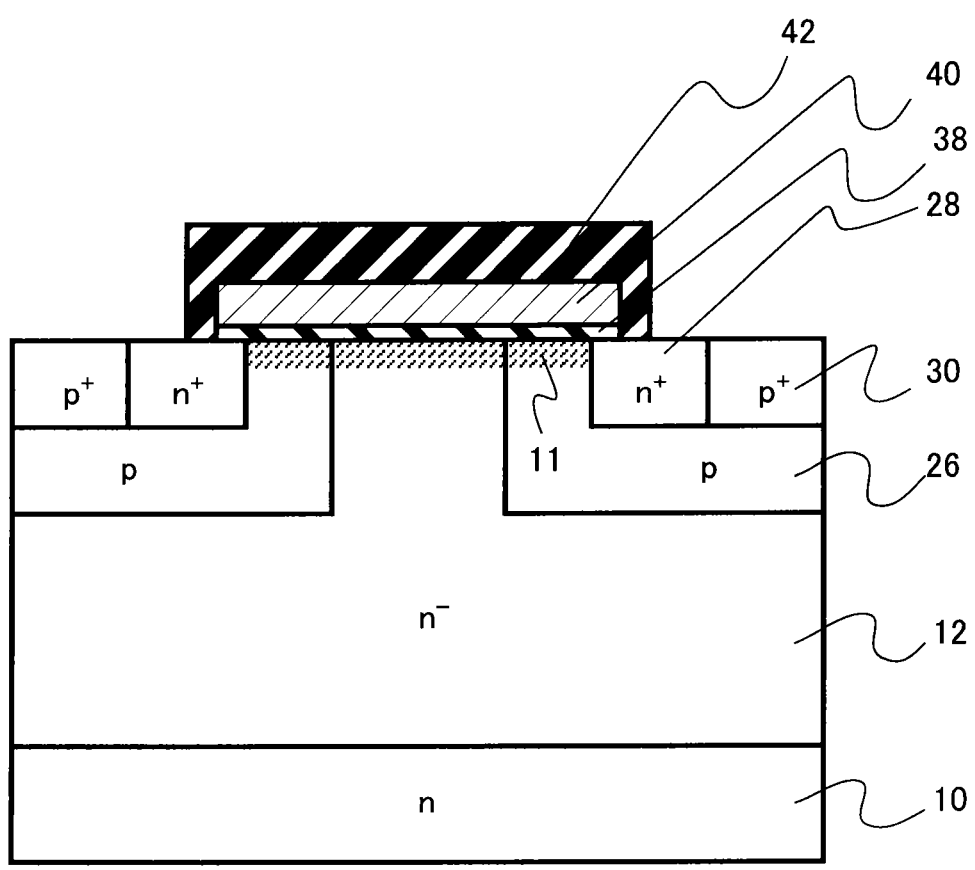
FIG. 12 is a schematic cross-sectional diagram illustrating the semiconductor device in the course of manufacture in the manufacturing method for the semiconductor device according to the second embodiment.

Next, for example, the gate insulating film 38 of an $SiO_2$ film is formed by a Chemical Vapor Deposition (CVD) method or a thermal oxidation method. Further, for example, the gate electrode 40 of polysilicon is formed on the gate insulating film 38. Then, for example, the interlayer dielectric 42 of an $SiO_2$ film is formed on the gate electrode 40 (FIG. 12).

Next, the conductive first electrode (source/p-well common electrode) 34 electrically connected to the second SiC region (source region) 28 and the third SiC region (p-well contact region) 30 is formed. The first electrode (source/p-well common electrode) 34 is formed of, for example, a sputter of nickel (Ni) and Al.

Next, the conductive second electrode (drain electrode) 44 is formed on the second surface side of the $n^+$-type SiC substrate 10. The second electrode (drain electrode) 44 is formed of, for example, a sputter of nickel Ni.

Subsequently, low-temperature annealing is applied to reduce contact resistance of the first electrode 34 and the second electrode 44. Annealing is applied at the temperature 400° C. in an argon atmosphere.

The MOSFET 200 illustrated in FIG. 6 is formed by the above-described manufacturing method.

In the following, functions and effects of the present embodiment will be described in detail.

When any carbon vacancy exists in the channel region of the SiC MOSFET, carrier mobility is decreased by carrier scattering caused by the carbon vacancy. Therefore, there may be a problem in which on-resistance of the MOSFET becomes high.

According to the manufacturing method of the present embodiment, carbon (C) is introduced into the p-type first SiC region (p-well region) 26 on the surface of the SiC layer 12 by annealing or oxidizing the SiC layer 12 in the atmosphere where the gas including carbon (C) exists. Further, the carbon vacancy inside the p-well region 26 is filled with the introduced carbon (C) and the concentration of the carbon vacancies is reduced. A region where the concentration of the carbon vacancies is reduced becomes the low level density region 11.

The p-well region 26 functions as the channel region of the MOSFET 200. Therefore, carrier mobility is improved. As a result, the MOSFET 200 having low on-resistance can be implemented.

From the viewpoint of improving carrier mobility, preferably, the low level density region 11 is at least formed in the range of 0.3 μm or less from the interface between the gate insulating film 38 and the first SiC region 26 on which mainly the channel is formed. Further, preferably, the low level density region 11 is also formed on the SiC layer 12 to be the drift layer from the viewpoint of improving carrier mobility.

Additionally, according to the manufacturing method of the present embodiment, carbon (C) is introduced from a gas phase. Therefore, a defect such as dislocation inside a crystal is more prevented from being generated, compared to the case where carbon (C) is introduced by ion implantation. Therefore, deterioration of a device property caused by introducing carbon (C) can be reduced.

Further, in the case where carbon (C) is introduced by ion implantation, preferably, high-temperature annealing at the temperature of, for example, 1600° C. or higher is applied in order to recover damage from the ion implantation and to activate carbon (C). The higher the temperature is, the higher the equilibrium concentration of carbon vacancy inside SiC tends to be. Therefore, the amount of carbon vacancies may not be sufficiently reduced by the high-temperature annealing.

According to the present embodiment, the amount of carbon vacancies can be more reduced by a low-temperature process, compared to ion implantation. Therefore, the concentration of the carbon vacancies inside SiC can be more reduced.

Further, according to the present embodiment, the SiC layer 12 is annealed or oxidized in the atmosphere where the gas including carbon (C) exists after forming the p-well region 26 inside the n$^-$-type SiC layer 12 by Al ion implantation. Inside the p-well region 26, a defect such as the carbon vacancy caused by ion implantation remains. Such a defect caused by ion implantation may deteriorate carrier mobility and increase on-resistance of the MOSFET.

According to the present embodiment, carbon (C) is introduced into the p-well region 26 from the atmosphere where the gas including carbon (C) exists, thereby inactivating the defect caused by ion implantation. Therefore, the MOSFET 200 having low on-resistance can be implemented.

According to the present embodiment, a description has been given for the case where annealing (second thermal treatment) for activation after ion implantation and the thermal treatment of carbon (C) introduction (first thermal treatment) are the separate processes. However, both processes can be made common and can be executed as one process. More specifically, the process of annealing or oxidizing the SiC layer 12 in the atmosphere where the gas including carbon (C) exists can be also executed, combining impurity activation with carbon (C) introduction upon activation after ion implantation.

According to the present embodiment, the manufacturing method for the MOSFET and the MOSFET, capable of reducing an amount of defects such as the carbon vacancies can be implemented.

Third Embodiment

A semiconductor device according to a present embodiment includes: a second conductivity type SiC substrate having a first surface and a second surface mutually facing; a first conductivity type SiC layer disposed on the first surface side of the SiC substrate; a second conductivity type first SiC region disposed on a surface of the Sic layer and including a low level density region having $Z_{1/2}$ level density of $1 \times 10^{11}$ cm$^{-3}$ or less measured by a DLTS; a first conductivity type second SiC region disposed on a surface of the first Sic region; a gate insulating film continuously formed on surfaces of the Sic layer and the first SiC region; a gate electrode disposed on the gate insulating film; a first electrode disposed on the second SiC region; and a second electrode disposed on the second surface side of the SiC substrate.

The semiconductor device according to the present embodiment is different from first and second embodiments in a point that the semiconductor device is an Insulated Gate Bipolar Transistor (IGBT). In the following, a description for contents overlapping with the first and second embodiments will be omitted.

Figure 13:
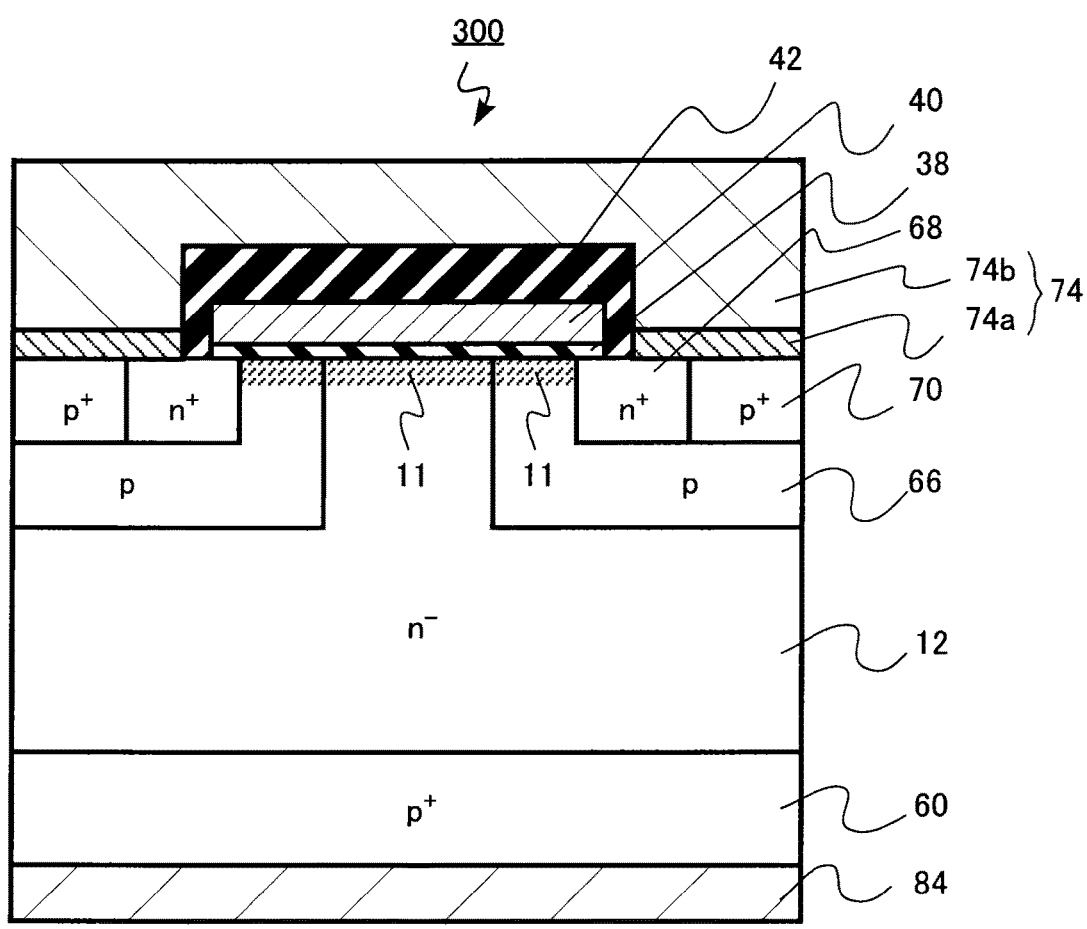
FIG. 13 is a schematic cross-sectional diagram illustrating a semiconductor device according to a third embodiment.

FIG. 13 is a schematic cross-sectional diagram illustrating the semiconductor device according to the present embodiment. A semiconductor device 300 according to the embodiment is the IGBT.

The IGBT 300 includes an SiC substrate 60. The SiC substrate 60 is, for example, p$^+$-type single crystal SiC substrate. For example, the SiC substrate 60 is a 4H—SiC substrate having a surface inclined from a plane {0001} at an off angle of 0.2 degrees or more and 10 degrees or less. The SiC substrate 60 includes, for example, aluminum (Al) as a p-type impurity. The SiC substrate 60 has an impurity concentration of, for example, $1 \times 10^{17}$ cm$^{-3}$ or more and $1 \times 10^{20}$ cm$^{-3}$ or less. The SiC substrate 60 includes the first surface and the second surface.

An n$^-$-type SiC layer 12 is formed on the first surface of the SiC substrate 60. The n$^-$-type SiC layer 12 is an epitaxial growth layer. The n$^-$-type SiC layer 12 is a drift layer of the IGBT 300.

The n$^-$-type SiC layer 12 includes, for example, nitride (N) as an n-type impurity. The n$^-$-type SiC layer 12 has the impurity concentration of $1 \times 10^{15}$ cm$^{-3}$ or more and $5 \times 10^{16}$ cm$^{-3}$ or less, for example. The n-type SiC layer 12 has film thickness of, for example, 5 µm or more and 200 µm or less.

A surface of the n$^-$-type SiC layer 12 is partly formed with a p-type first SiC region (p-base region) 66 having the impurity concentration of p-type impurity of, for example, $5 \times 10^{15}$ or more and $1 \times 10^{17}$ cm$^{-3}$ or less. The p-base region 66 has a depth of, for example, about 0.6 µm. The p-base region 66 functions as a channel region of the IGBT 300.

The p-type first SiC region (p-base region) 66 includes a low level density region 11 having the $Z_{1/2}$ level density of $1 \times 10^{11}$ cm$^{-3}$ or less measured by the DLTS. Further, the low level density region 11 having the $Z_{1/2}$ level density of $1 \times 10^{11}$ cm$^{-3}$ or less measured by the DLTS is also formed on the n$^-$-type SiC layer 12 interposed by the p-base region 66.

A surface of the first SiC region (p-base region) 66 is partly formed with, for example, an n$^+$-type second SiC region (emitter region) 68 having the impurity concentration of n-type impurity, for example, $1 \times 10^{18}$ or more and $1 \times 10^{22}$ cm$^{-3}$ or less. The emitter region 68 has a depth smaller than the depth of the first SiC region (p-base region) 66, for example, about 0.3 µm.

Further, a p$^+$-type third Sic region (p-base contact region) 70 having the impurity concentration of p-type impurity, for example, substantially $1 \times 10^{18}$ or more and $1 \times 10^{22}$ cm$^{-3}$ or less is formed on a part of the surface of the first SiC region (p-base region) 66 on a side next to the n$^+$-type second Sic region (emitter region) 68. The p-base contact region 70 has the depth smaller than the depth of the first Sic region (p-base region) 66, for example, about 0.3 µm.

A gate insulating film 38 is continuously formed on the surfaces of the SiC layer 12 and the first SiC region (p-base region) 66 so as to extend across the layer and the region. For the gate insulating film 38, for example, an SiO$_2$ film or a high-k insulator film is applicable.

Further, a gate electrode 40 is formed on the gate insulating film 38. For the gate electrode 40, for example, polysilicon or the like is applicable. On the gate electrode 40, an interlayer dielectric 42 formed of the SiO$_2$ film is formed, for example.

The first SiC region 66 interposed between the second SiC region (emitter region) 68 and the SiC layer 12 under the gate electrode 40 functions as the channel region of the IGBT 300.

Preferably, the low level density region 11 is located in a range of 0.3 μm or less from an interface between the first SiC region 66 and the gate insulating film 38 on the SiC substrate 10 side.

Further, a conductive first electrode (emitter/p-base common electrode) 74 electrically connected to the second SiC region (emitter region) 68 and the third SiC region (p-base contact region) 70 is provided. The emitter/p-base common electrode 74 is formed of, for example, a nickel (Ni) barrier metal layer 74a and an Al metal layer 74b disposed on the barrier metal layer 74a. The Ni barrier metal layer 74a and the Al metal layer 74b may form alloy by reaction.

Further, a conductive second electrode (collector electrode) 84 is formed on the second surface side of the SiC substrate 10. The collector electrode 84 is, for example, Ni.

Meanwhile, according to the present embodiment, preferably, nitride (N) or phosphorus (P) is applied as the n-type impurity, for example, but arsenic (As) or the like may also be applicable. Further, preferably, aluminum (Al) is applied as the p-type impurity, for example, but boron (B), gallium (Ga), indium (In), or the like may also be applicable.

The manufacturing method for the semiconductor device according to the present embodiment is same as the second embodiment except for using the p+-type SiC substrate 60 instead of the n+-type SiC substrate 10. Therefore, a description for processes after forming the n−-type SiC layer 12 on the p+-type SiC substrate 60 will be omitted.

In the following, functions and effects of the present embodiment will be described.

According to the present embodiment, carrier mobility is improved on the first SiC region (p-base region) 66 immediately below the gate insulating film 38 to be the channel region because of the function same as the second embodiment. Therefore, the IGBT 300 having low on-resistance is implemented.

Further, according to the present embodiment, concentration of carbon vacancies in the n−-type SiC layer (drift layer) 12 interposed by the p-base region 66 is reduced. Therefore, carrier mobility in this region is improved and the IGBT 300 having the low on-resistance is implemented. Moreover, a minority carrier lifetime in the drift layer 12 is improved due to reduction of the amount of carbon vacancies, and the IGBT 300 having the low on-voltage is implemented.

According to the present embodiment, the manufacturing method for the IGBT and the IGBT, capable of reducing an amount of defects such as the carbon vacancies can be implemented.

As described above, according to the embodiments, the description has been given for the examples where silicon carbide has a crystal structure of 4H—SiC, but the present disclosure is applicable to other crystal structures of silicon carbide such as 6H—SiC and 3C—SiC.

Further, according to the embodiments, the description has been given for the examples where the PIN diode and the IGBT are applied as a bipolar device, but the present disclosure is applicable to other bipolar devices such as Bipolar Junction Transistor (BJT) as long as it is the bipolar device.

Furthermore, according to the embodiments, the description has been given by exemplifying the device in which the first conductivity type is the n-type and the second conductivity type is the p-type, but the device in which the first conductivity is the p-type and the second conductivity type is the n-type can be applied, too.

Additionally, according to the embodiments, the description has been given for the examples in which the ion of the n-type impurity or the p-type impurity is implanted into the SiC layer, but thermal treatment to anneal or oxidize the SiC layer in the atmosphere where the gas including carbon (C) exists can be executed after executing carbon (C) ion implantation separately or in addition to the n-type impurity and the p-type impurity.

While certain embodiments have been described, these embodiments have been presented by way of example only, and are not intended to limit the scope of the inventions. Indeed, the manufacturing method for the semiconductor device and the semiconductor device. described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A manufacturing method for a semiconductor device, comprising:
    ion-implanting a p-type impurity, n-type impurity, or carbon (C) to an SiC layer; then
    applying a first annealing of the SiC layer; and then
    applying a second annealing or oxidizing of the SiC layer in an atmosphere where a gas of propane exists, a temperature in the first annealing being higher than a temperature in the second annealing or oxidizing, the second annealing or oxidizing being heat treatment without growth of an SiC film, and the temperature in the second annealing or oxidizing is 1400° C. or more and 1600° C. or less.

2. The method according to claim 1, wherein the temperature in the first annealing is 1600° C. or more and 1800° C. or less.

3. The method according to claim 1, wherein a dose amount in the ion-implanting is $1\times10^{15}$ cm$^{-2}$ or more.

4. The method according to claim 1, further comprising forming the SiC layer on an SiC substrate by an epitaxial growth method before the second annealing or oxidizing.

5. The method according to claim 1, wherein an ion of the n-type impurity or the p-type impurity is selectively implanted into the SiC layer at the ion-implanting.

6. A manufacturing method for a semiconductor device, comprising:
    ion-implanting a p-type impurity, n-type impurity, or carbon (C) to an SiC layer; then
    applying a first annealing of the SiC layer; and then
    applying a second annealing or oxidizing of the SiC layer in an atmosphere where a gas of hydrocarbon exists, a temperature in the first annealing being higher than a temperature in the second annealing or oxidizing, the second annealing or oxidizing being heat treatment without growth of an SiC film, and the temperature in the second annealing or oxidizing is 1400° C. or more and 1600° C. or less,
    wherein the SiC film after applying the second annealing or oxidizing includes $Z_{1/2}$ level density of $1\times10^{11}$ cm$^{-3}$ or less measured by deep level transient spectroscopy (DLTS).

* * * * *